United States Patent [19] [11] 3,961,355
Abbas et al. [45] June 1, 1976

[54] SEMICONDUCTOR DEVICE HAVING ELECTRICALLY INSULATING BARRIERS FOR SURFACE LEAKAGE SENSITIVE DEVICES AND METHOD OF FORMING

[75] Inventors: Shakir A. Abbas; Chi S. Chang, both of Wappingers Falls; Leo B. Freeman, Jr., Poughkeepsie; Ronald W. Knepper, Fishkill, all of N.Y.

[73] Assignee: International Business Machines Corporation, Armonk, N.Y.

[22] Filed: Nov. 18, 1974

[21] Appl. No.: 524,602

Related U.S. Application Data

[63] Continuation of Ser. No. 267,771, June 30, 1972, abandoned.

[52] U.S. Cl. ................................. 357/49; 357/24; 357/41; 357/45; 307/238
[51] Int. Cl.² ...................................... H01L 27/12
[58] Field of Search ................ 357/20, 41, 45, 49, 357/50, 24; 307/238

[56] References Cited
UNITED STATES PATENTS

| 3,354,360 | 11/1967 | Campagna et al. | 357/50 |
| 3,492,174 | 1/1970 | Nakamura et al. | 357/50 |
| 3,509,433 | 4/1970 | Schroeder | 357/49 |
| 3,648,125 | 3/1972 | Peltzer | 357/50 |
| 3,783,047 | 1/1974 | Paffew et al. | 357/50 |
| 3,786,318 | 1/1974 | Monoi et al. | 357/50 |
| 3,906,544 | 9/1975 | Engeler et al. | 357/24 |

Primary Examiner—Andrew J. James
Assistant Examiner—Joseph E. Clawson, Jr.
Attorney, Agent, or Firm—Robert J. Haase

[57] ABSTRACT

A semiconductor device has a heavily doped semiconductor substrate with a lightly doped epitaxial layer overlying a surface of the substrate and of the same conductivity type as the substrate. Electrically insulating barriers extend from at least the surface of the epitaxial layer into the substrate so as to electrically isolate non-common areas of each surface leakage sensitive device within the epitaxial layer from the non-common areas of adjacent surface leakage sensitive devices.

6 Claims, 12 Drawing Figures

SEMICONDUCTOR DEVICE HAVING ELECTRICALLY INSULATING BARRIERS FOR SURFACE LEAKAGE SENSITIVE DEVICES AND METHOD OF FORMING

This is a continuation of application Ser. No. 267,771 filed June 30, 1972 now abandoned.

In integrated circuits, it is desired to have a maximum number of storage or memory cells on a chip. One type of storage cell on a chip comprises a filed effect transistor (FET) in series with a capacitor. This type of cell is a surface leakage sensitive device so that the cells cannot be placed too close together or there will be a parasitic connection between adjacent storage cells whereby the data would not be retained in each cell. This necessity for keeping the cells sufficiently spaced from each other to prevent parasitic connections therebetween has caused the number of cells on each chip to be limited.

The present invention enables a chip to have a higher density of storage cells of the type having an FET in series with a capacitor than previously available without any parasitic connection between the non-common areas of the surface leakage sensitive devices. Thus, the present invention enables a chip to have a higher density of storage cells without affecting the yield while obtaining the desired performance of the storage cells.

The present invention accomplishes this by electrically isolating the non-common areas of each of the storage cells, which comprise an FET in series with a capacitor, on the chip by providing an electrically insulating barrier, which is preferably silicon dioxide, from at least the surface of the epitaxial layer in which the surface leakage sensitive devices are disposed and through the epitaxial layer and into the substrate. However, the insulating barriers extend for only a short distance, which is preferably substantially less than the thickness of the substrate, into the substrate so that there is no electrical isolation of a common area, which is the substrate, for all of the storage cells.

Since the storage cells, which comprise an FET in series with a capacitor in each cell, of each group of storage cells are connected to each other through a diffused bit line in the epitaxial layer, the capacitance of the bit line affects the size of the capacitor of the storage cell. Thus, a reduction in the bit line capacitance will enable the area of the storage cell of the capacitor to be decreased without affecting the sensing signal.

The electrical insulating barrier of the present invention significantly reduces the bit line capacitance by eliminating both its lateral diffusion and its side wall capacitance. The barriers are disposed in the epitaxial layer on both sides of the area in which the bit line is diffused except for the connection to the channel areas of the FETs.

This decrease of the bit line capacitance enables the size of the storage capacitor, which is in series with the FET to form the storage cell and is formed in the epitaxial layer, to be significantly reduced. This is because the bit line capacitance is reduced approximately 50 percent by the use of the present invention so that a sufficient sensing signal can be provided from the capacitor of the storage cell with the area of the storage cell capacitor being approximately half of that of the previously available storage cells in which an FET is in series with the capacitor.

In the previously available storage cells having an FET in series with a capacitor, either a silicon or metal gate has been exclusively used. When using silicon gates, the need for a contact to either a word line or a bit line and the extraneous diffusion resulting from separation of the FET device gate and the capacitor voltage electrode or terminal has wasted a portion of the area of the chip. As a result, the number of cells on a chip has been substantially less than the number of cells that could be placed upon the chip.

When using a metal gate, the cell area also has been wasted. This is because the width of the metal word line and the metal-metal spacing limits required between the word and capacitor voltage lines, which are parallel to each other, have increased the size of each cell area beyond that needed for the cell per se.

The present invention overcomes the foregoing problems since it allows each gate of the storage cells on a chip to be either polysilicon or metal. This eliminates all cell contacts while permitting a polysilicon capacitor voltage line and an orthogonal metal word line. The diffusion between the FET under the word line and the polysilicon capacitor voltage line also is eliminated.

Furthermore, the process of the present invention produces a self-aligned gate irrespective of whether the gate is metal or silicon since the gate insulating layer is disposed on the surface of the epitaxial layer in the desired area prior to diffusion into the epitaxial layer so that overlapping of the diffusion by the gate is reduced to a minimum. Thus, this self-aligned gate feature results in the coupling between the word line and the bit line being at a minimum.

The use of electrically insulating barriers to isolate various portions of a semiconductor device having a heavily doped substrate with a lightly doped epitaxial layer of the same conductivity has been previously suggested in U.S. Pat. No. 3,343,255 to Donovan. However, in the aforesaid Donovan patent, the insulating barriers are formed from the bottom of the substrate through the substrate and the epitaxial layer to the top of the epitaxial layer. If the barrier of the aforesaid Donovan patent were formed by growing silicon dioxide, for example, the barrier would have the same width as the depth for which it extends because silicon dioxide grows for the same distance along its width as along its depth. With the substrate being relatively thick such as 6 mils, for example, in comparison with the epitaxial layer, which might be less than two microns, for example, each barrier would take up a large portion of the substrate.

Furthermore, barriers of the aforesaid Donovan patent electrically isolate each part of the substrate from each other so that there can be no common terminal for devices within the various isolated areas. Additionally, the aforesaid Donovan patent discloses only non-surface leakage sensitive devices such as bipolar transistors, for example.

The aforesaid Donovan patent also requires a layer of solder and a quartz plate disposed above the silicon dioxide layer on the eptiaxial layer when the insulating barriers are formed. This can produce significant contamination problems of the transistors in the epitaxial layer.

The present invention overcomes the problems of the aforesaid Donovan patent since it is able to have the insulating barrier penetrate only a slight distance into the substrate. This prevents any surface leakage through the substrate while still enabling the substrate to function as a common terminal for each of the surface leakage sensitive devices in the epitaxial layer. By forming the silicon dioxide barrier from the surface of the epitaxial layer, its thickness is relatively slight in comparison with that which would be produced by forming the barrier from the substrate surface opposite the epitaxial layer so that it does not prevent maximum utilization of the chip to form storage cells as would occur if the method of the aforesaid Donovan patent were employed.

An object of this invention is to provide an increase in the density of storage cells on a chip.

Another object of this invention is to provide a semiconductor device having surface leakage sensitive devices in which the non-common areas of each of the surface leakage sensitive devices are electrically isolated from the non-common areas of other surface leakage sensitive devices while permitting all of the surface leakage sensitive devices to have at least one common terminal.

A further object of this invention is to provide a method for forming a semiconductor device having the non-common areas of surface leakage sensitive devices electrically isolated while the surface leakage sensitive devices have a common terminal.

The foregoing and other objects, features, and advantages of the invention will be more apparent from the following more particular description of the preferred embodiments of the invention as illustrated in the accompanying drawings.

Figure 1:
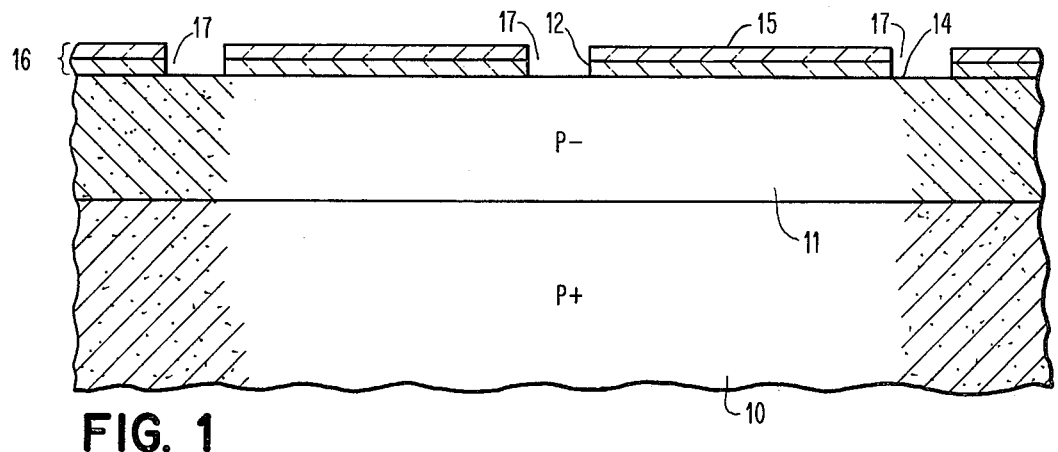
FIGS. 1–8 are schematic sectional views showing various steps in fabricating a semiconductor device of the present invention with the vertical scale being approximately ten times the horizontal scale.

Referring to the drawings and particularly FIG. 1, there is shown a substrate 10, which is preferably monocrystalline silicon, of a heavily doped concentration such as P+, for example. A lightly doped epitaxial layer 11 of P− conductivity is grown on a top surface of the substrate 10 with a thickness of about 1.75 microns and a resistivity of 2 ohms-cm. The substrate 10 has a thickness of about 6 mils, for example, and a resistivity of about 0.2 ohm-cm.

The epitaxial layer 11 has a layer 12 of silicon dioxide grown on its surface 14 with a thickness of about 300A. A layer 15 of silicon nitride ($Si_3N_4$) is deposited on the silicon dioxide layer by chemical vapor deposition with a thickness of about 300A. The layers 12 and 15 combine to form a single layer 16 of insulating material over the epitaxial layer 11 with the layer 16 having a thickness of approximately 600A.

After the layer 16 has been formed over the surface 14 of the epitaxial layer 11, a mask is deposited on top of the insulating layer 16 and portions of the layer 16 are etched away to form openings or passages 17 in the layer 16. This etching of the layer 16 is preferably in two steps with a first etchant being employed to each the layer 15 of silicon nitride and a second etchant being employed to etch the silicon dioxide layer 12. This enables precise control of the etching of each of the layers 12 and 15.

FIG. 1 discloses a portion of the semiconductor device after the foregoing steps have been completed. The openings or passages 17 are formed over the portions of the epitaxial layer 11 where no devices are to be located. Thus, the openings or passages 17 are of different widths and extend at right angles to each other in various portions of the insulating layer 16.

Figure 2:
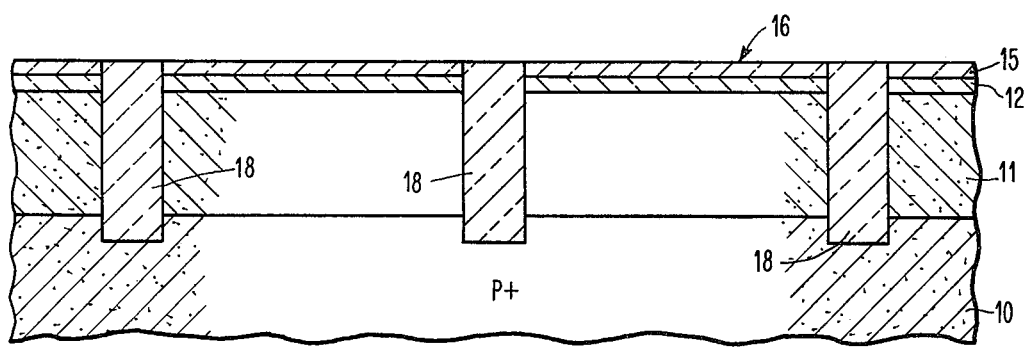

As shown in FIG. 2, insulating barriers 18 are formed in the epitaxial layer 11 and a portion of the substrate 10 through the openings or passages 17 in the layer 16. The barriers 18 extend only a slight distance into the substrate 10 to prevent any leakage of current through the substrate 10 at the locations of the insulating barriers 18. For example, with the epitaxial layer 11 having a thickness of 1.75 microns, the insulating barrier 18 would extend into the substrate 10 for less than 0.25 micron since the total depth of the insulating barrier 18 is 2 microns when the epitaxial layer 11 is 1.75 microns. Thus, the insulating barriers 18 do not electrically isolate portions of the substrate 10 so that the substrate 10 can function as a common terminal for all devices, particularly surface leakage sensitive devices, in the epitaxial layer 11.

Figure 9:
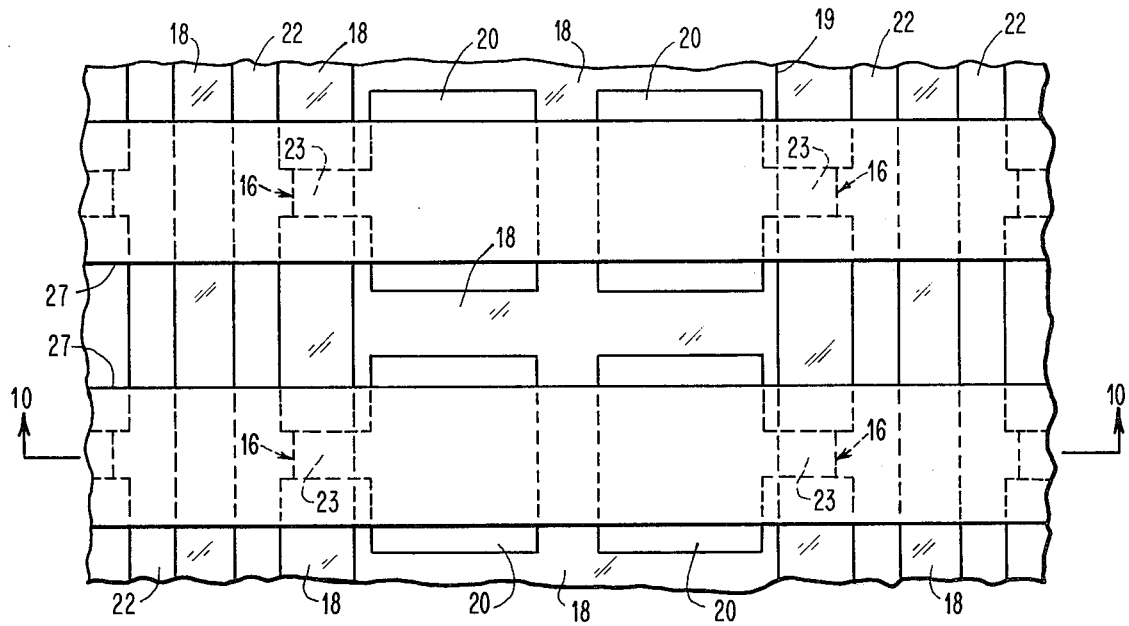
FIG. 9 is a top plan view of a portion of one type of semiconductor device of the present invention.

As previously mentioned, the openings or passages 17 in the insulating layer 16 are of different widths and extend at right angles to each other in various portions of the insulating layer 16. Accordingly, as shown in FIG. 9, the insulating barriers 18 have portions of different widths and portions extending at right angles to each other. These are not shown in FIG. 2 because this is a sectional view in an area in which there are surface leakage sensitive devices in the epitaxial layer 11.

The insulating barrier 18 may be formed of any suitable insulating material and formed in any suitable manner. However, with the substrate 10 formed of silicon, it is preferred that the insulating barrier 18 be silicon dioxide and that the barrier 18 be formed by first oxidizing, preferably by thermal oxidation, the portions of the epitaxial layer 11 exposed by the openings or passages 17 in the layer 16. The oxidation of the epitaxial layer 11 consumes part of the epitaxial layer 11.

The silicon dioxide which is formed by thermal oxidation of the epitaxial layer 11 so as to consume part thereof is then removed with a suitable etchant such a hydrofluoric acid, for example. This results in grooves or trenches being produced in the epitaxial layer 11 and extending approximately half way through the epitaxial layer 11.

Then, oxidizing, again preferably by thermal oxidation, occurs through the remainder of the thickness of the epitaxial layer 11 and a portion of the substrate to produce the insulating barrier 18 as shown in FIG. 2. The penetration of the insulating barrier 18 into the substrate 10 is sufficient to prevent any surface leakage current through the epitaxial layer 11 adjacent to its boundary with the barrier 18 since such could occur if the barrier 18 did not extend into the substrate 10. As shown in FIG. 2, the upper surface of each of the barriers 18 is planar with the upper surface of the insulating layer 16.

A layer 19 (see FIG. 3) of polysilicon, for example, is next deposited on top of the insulating layer 16 and the insulating barriers 18. This may be deposited in any suitable manner such as by chemical vapor deposition, for example. The layer 19 may also be formed of any refractory material. It is only necessary that the material be a conductor and be capable of withstanding the high temperatures incurred during diffusion.

If desired, the insulating layer 16 and the portions of the barriers 18 extending above the surface 14 of the epitaxial layer 11 could be removed prior to the deposition of the layer 19 of polysilicon and then the layer 16 again formed on the surface 14 of the epitaxial layer 11 so that the entire surface 14 is covered by the insulating layer 16, which extends over the tops of all of the barriers 18. The layer 16 would again comprise the layer 12 of silicon dioxide and the layer 15 of silicon nitride with each being approximately 300A in thickness.

After the layer 19 of polysilicon has been deposited over the insulating layer 16 and the tops of the insulating barriers 18 or only over the layer 16 if the layer 16 is again formed so that the tops of the insulating barriers 18 are beneath the layer 16, the layer 19 of polysilicon is removed from various areas through the use of a mask and an etchant. For example, the photolithographic process could be employed whereby photoresist would be deposited over the layer 19 of polysilicon and the photoresist exposed by a mask in the areas in which the layer 19 of polysilicon is to be removed. After developing, the exposed photoresist and the underlying polysilicon is removed by an etchant.

Figure 3:
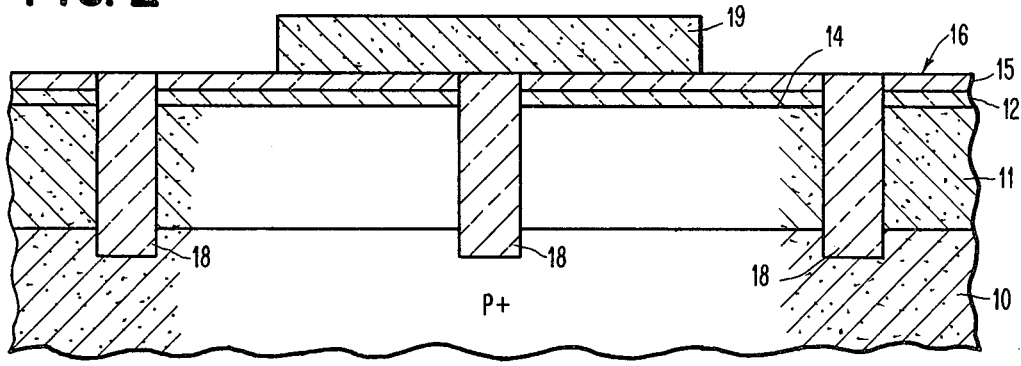

As a result, the layer 19 of polysilicon lies only over the portions of the insulating layer 16 in which the layer 19 of polysilicon is to function as a gate or a line. As shown in FIG. 3, the layer 19 of polysilicon will function only as a line to supply a voltage to capacitors which are on opposite sides of the center barrier 18 of FIG. 3. It should be understood that the layer 19 of polysilicon is divided into a plurality of spaced longitudinal strips where it functions as a line with each line overlying a plurality of capacitors of the cells. As shown in FIG. 9, the layer 19 of polysilicon overlies areas 20 in the epitaxial layer 11 beneath the insulating layer 16 and on opposite sides of the insulating barrier 18.

Figure 4:
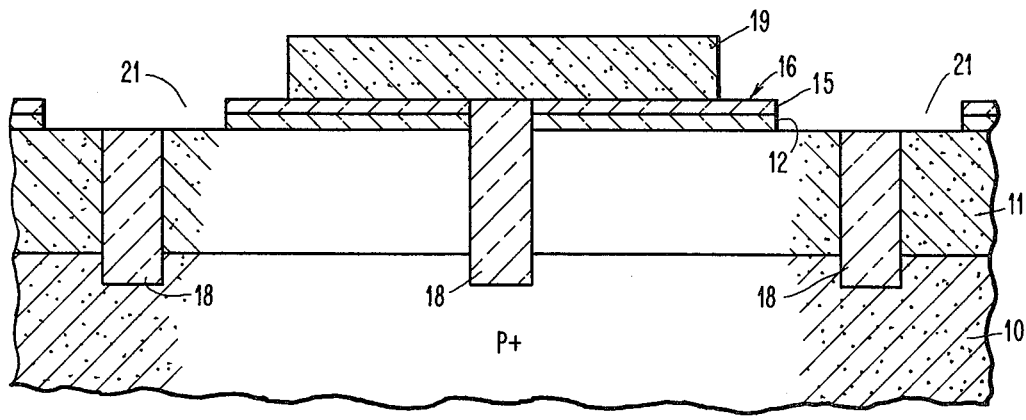

After the layer 19 of polysilicon has been formed into the various lines (only one shown in FIGS. 3 and 9) on the insulating layer 16, a mask is formed over the insulating layer 16, the layer 19 of polysilicon, and the tops of the insulating barriers 18 so that openings or passages 21 (see FIG. 4) may be formed in the layer 16. The openings 21 are formed by etching, preferably in two steps, the layer 15 of silicon nitride and the layer 12 of silicon dioxide in the same manner as previously mentioned when the openings 17 were formed in the insulating layers 16.

Figure 5:
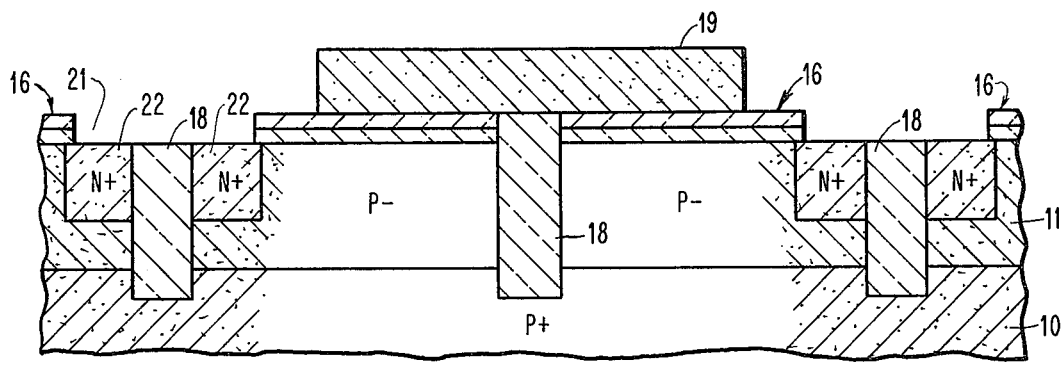

The insulating layer 16 is etched away except where a channel area 23 of an FET or the area 20, which functions as a capacitor with the insulating layer 16 being the dielectric and the layer 19 of polysilicon being the other electrode, is to be formed in the epitaxial layer 11. The openings 21 allow bit lines 22 to be diffused in the epitaxial layer 11, as shown in FIG. 5, on each side of the barrier 18. The layer 19 of polysilicon is doped at the same time.

It should be understood that one of the barriers 18 is on each side of each of the diffused bit lines 22 except where there is a connection to one of the FET channel areas 23. This relationship of the barriers 18 and the diffused bit lines 22 is shown in FIG. 9.

Each of the bit lines 22 has an N+ conductivity. When the epitaxial layer has a thickness of about 1.75 microns, each of the bit lines 22 extends into the epitaxial layer for approximately 1 micron.

As shown in FIG. 9, the bit line 22 connects to a plurality of the FET channel areas 23, which are formed in the epitaxial layer 11 beneath the insulating layer 16. As indicated in FIG. 9, the barriers 18 prevent any sidewise diffusion of the bit line 22 except to connect with the FET channel areas 23.

As shown in FIG. 9, the capacitor areas 20, which are disposed beneath the layer 19 of polysilicon and in th same row, are connected to two different of the bit lines 22. Each of the bit lines 22 is connected to a plurality of the FET channel areas 23.

Figure 6:
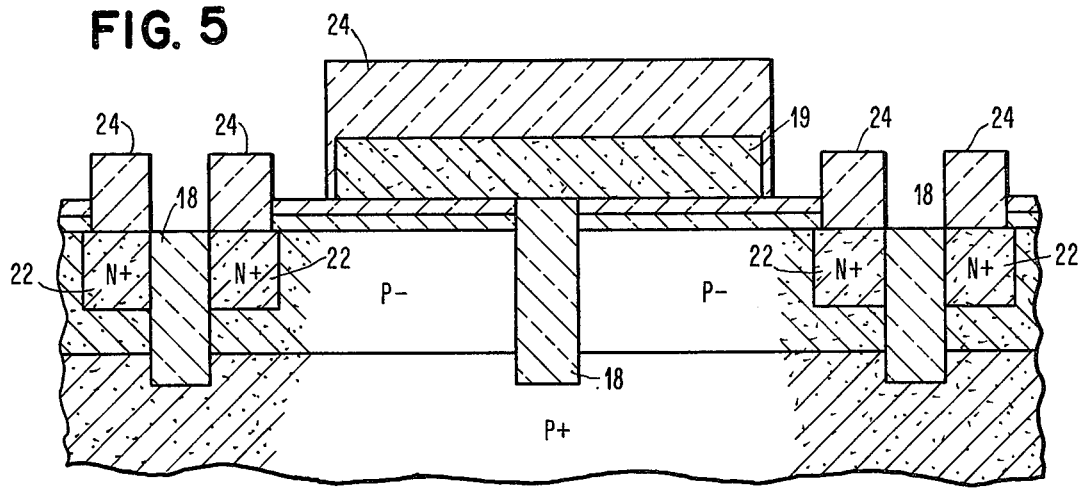

After the diffusion of the bit lines 22 into the epitaxial layer 11, a layer 24 of silicon dioxide is formed, preferably by thermal oxidation, over the diffused bit lines 22 and the segmented portions of the layer 19 of polysilicon. Therefore, the layer 24 comprises separated portion, as shown in FIG. 6, with a each having a thickness of approximately 5,000A. The growing of the layer 24 of silicon dioxide on the layer 19 of polysilicon results in the thickness of the layer 19 of polysilicon becoming approximately 3,000A.

As previously mentioned, the scale in a vertical direction is approximately ten times that in a horizontal direction. Thus, there would be a substantial amount of the layer 24 of silicon dioxide on each side of the layer 19 of polysilicon beyond that shown in FIG. 6.

Figure 7:
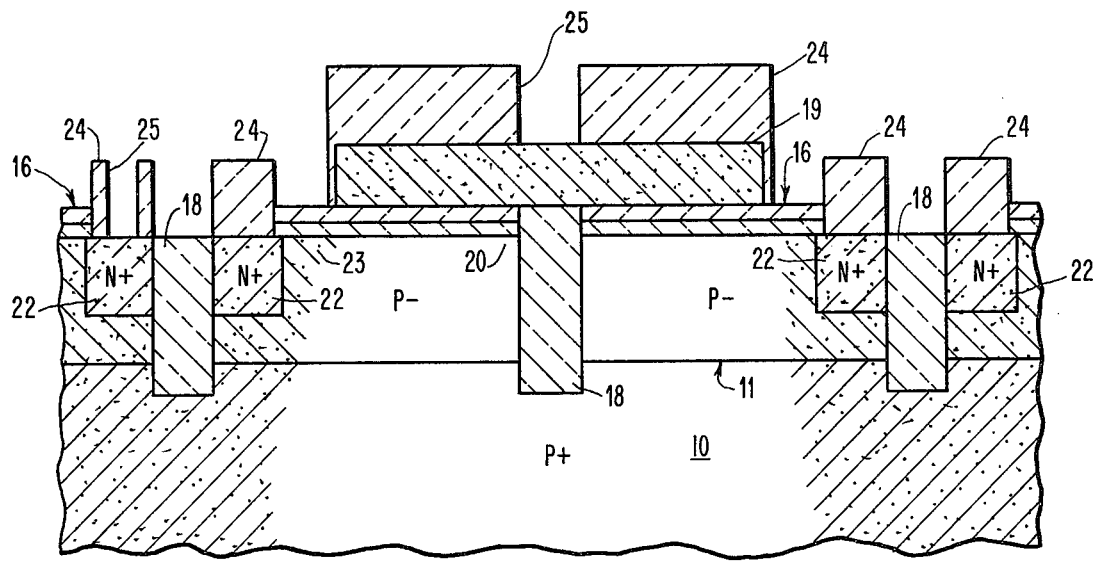

After the layer 24 of silicon dioxide is disposed over separated portions of the semiconductor device as shown in FIG. 6, a mask is deposited thereover to define contact holes or openings 25 through the separated portions of the layer 24 of silicon dioxide to the layer 19 of polysilicon and the diffused bit lines 22. As shown in FIG. 7, the openings 25 in the layer 24 expose the surface of one of the diffused bit lines 22 and the upper surface of the layer 19 of polysilicon.

If desired, the portion of the insulating layer 16 not covered by the layer 24 of silicon dioxide could be removed after growth of the layer 24 of silicon dioxide and prior to forming the openings 25 therein. This would necessitate again the two step etching removal of the portions of the layer 16 and then putting down the layer 16 in the same manner as it has previously been deposited. Thus, the newly deposited portions of the layer 16 would be formed over the FET channel areas 23. These extra steps would primarily be employed whenever there was a problem of contamination of the FET channel areas 23 in the epitaxial layer 11.

After the openings 25 have been formed in the layer 24 of silicon dioxide, a layer 26 of metal such as aluminum, for example, is deposited over the entire device with a thickness of about 10,000A. Then, a mask is placed over the layer 26 and an etchant is employed to remove the portions of the layer 26 of aluminum that are not to function as metal gates, ohmic contacts, or interconnections. As a result, FIG. 8 shows contacts connected to the layer 19 of polysilicon, the FET channel areas 23, and one of the bit lines 22.

Figure 8:
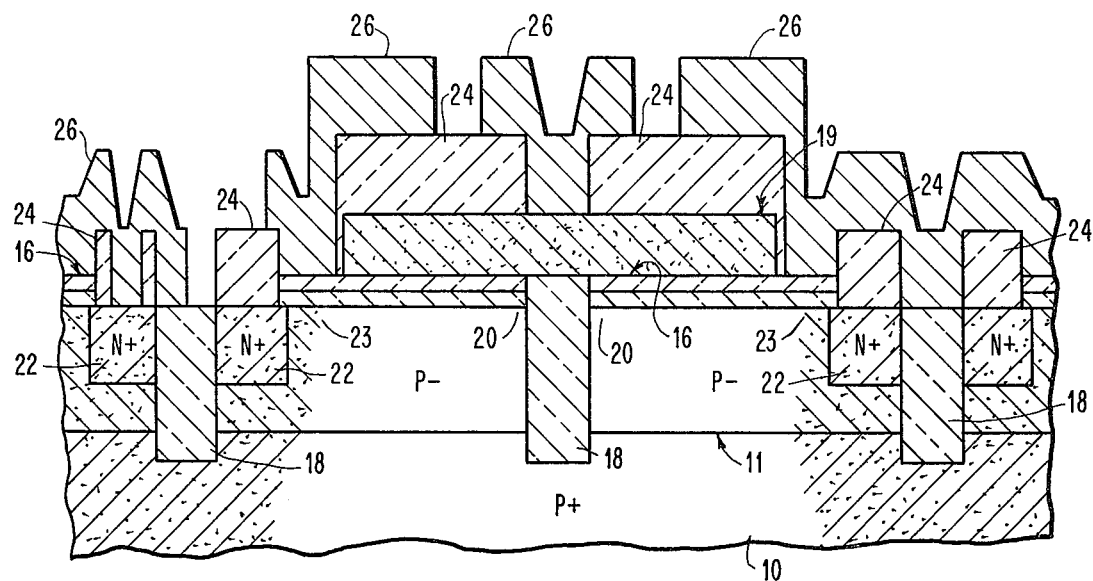

It should be understood that FIGS. 7 and 8 are not an actual circuit but are merely disclosing how various types of metallic contacts could be made to the FET channel areas 23, the diffused bit lines 22, and the layer 19 of polysilicon. Actually, the contact to the separated portions of the layer 19 of polysilicon will be made at one edge of the device as will the contacts to the diffused bit lines 22, but they will be as shown in FIG. 8.

Figure 10:
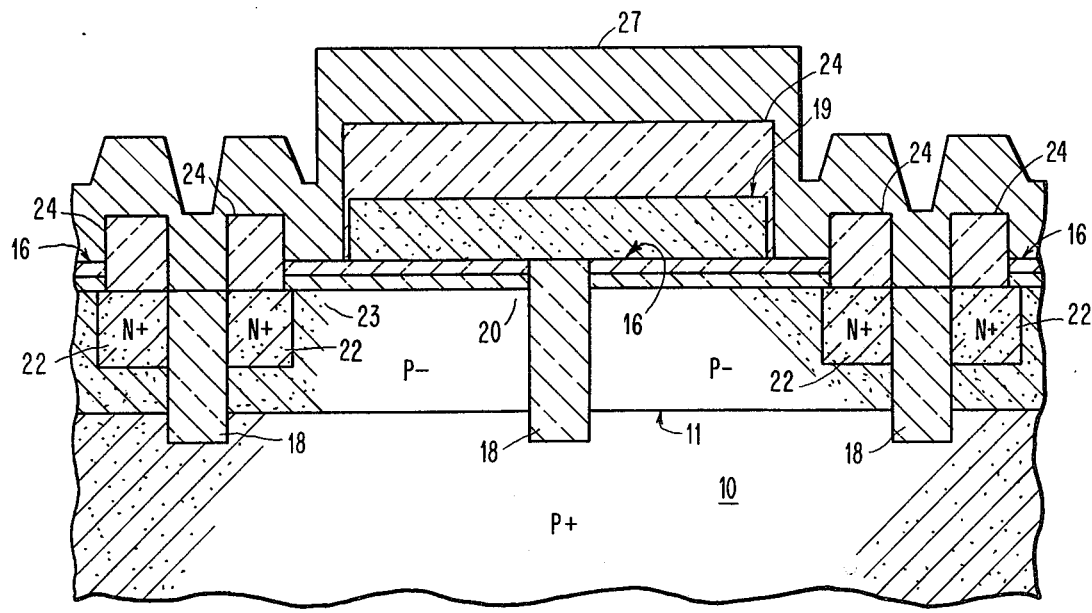
FIG. 10 is a sectional view of the device of FIG. 9 and taken along line 10—10 of FIG. 9 with the vertical scale being approximately ten times the horizontal scale.

Furthermore, there would not normally be a separate contact for each of the FET channel areas 23 in the same row as FIG. 8 indicates. Instead, as shown in FIG. 9, the layer 26 of aluminum is etched to form metallic word lines 27, which extend across the width of the device and are continuous as is evident from FIG. 10, connected to all of the channel areas 23 of storage cells in the same row.

The capacitor of each cell is defined by the insulating layer 16 functioning as the dielectric with the layer 19 of polysilicon being one of the electrodes and the other being the channel area 20, which is beneath the insulating layer 16, in the epitaxial layer 11 when the layer 19 of polysilicon is biased so as to invert the surface 14 of the epitaxial layer 11. The area 20 also functions as one of the areas connected to the channel area 23 of the FET with which the capacitor is in series. The diffused bit line 22 functions as the other area connected to the channel area 23 of the FET while the channel area 23 is the reduced area beneath the insulating layer 16 and extending between the bit line 22 and the area 20.

As previously mentioned and shown in FIG. 9, the barriers 18 do not extend in only one direction but are so disposed that they electrically isolate the non-common areas (20 and 23) of each of the devices from the non-common areas (20 and 23) of the adjacent devices. This prevents any surface leakage between the non-common areas of the adjacent devices.

Figure 11:
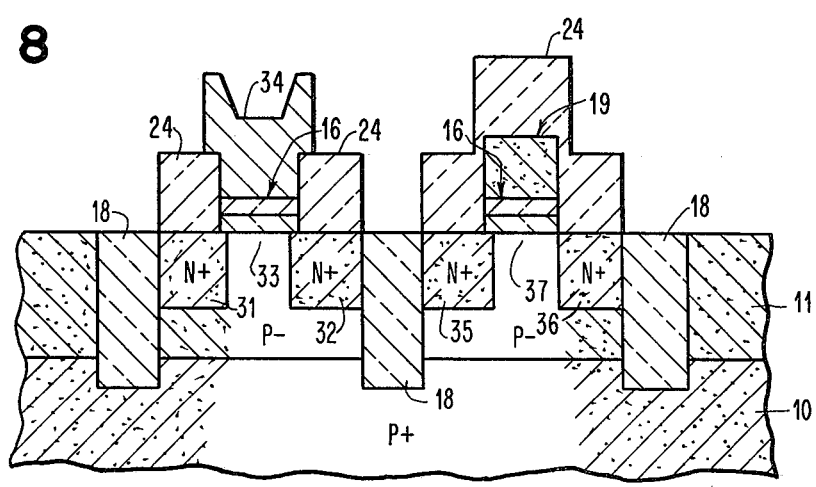
FIG. 11 is a fragmentary sectional view showing a portion of another semiconductor device of the present invention with the vertical scale being approximately ten times the horizontal scale.

Another semiconductor device which can be formed by the present invention is shown in FIG. 11 wherein the epitaxial layer 11 has two separate FETs formed between the insulating barriers 18. Diffusions 31 and 32 are formed in the epitaxial layer 11 between two of the barriers 18 to function as the source and drain areas of an FET having its channel area formed by an area 33, which is disposed beneath the insulating layer 16 of silicon nitride and silicon dioxide. The FET has a metallic electrode 34 so that this is a metal gate FET. It should be understood that the diffusions 31 and 32 and all other diffusions hereinafter discussed have the insulating barriers 18 on each side, as previously discussed, except where there is a connection to a channel area.

Between the barrier 18, which has the diffusion 32 adjacent thereto and another of the barriers 18, another FET is formed by diffusions 35 and 36 having a channel area 37 therebetween over which the insulating layer 16 is deposited. The layer 19 of polysilicon extends over the insulating layer 16, and the layer 24 of silicon dioxide is then grown over the layer 19 of polysilicon and the diffusions 35 and 36. This forms a silicon gate FET with the contact to the layer 19 of polysilicon being made at the edge of the device as are the connections to the diffusions 35 and 36. Thus, the device of FIG. 11 shows a silicon gate FET and a metal gate FET adjacent each other.

Figure 12:
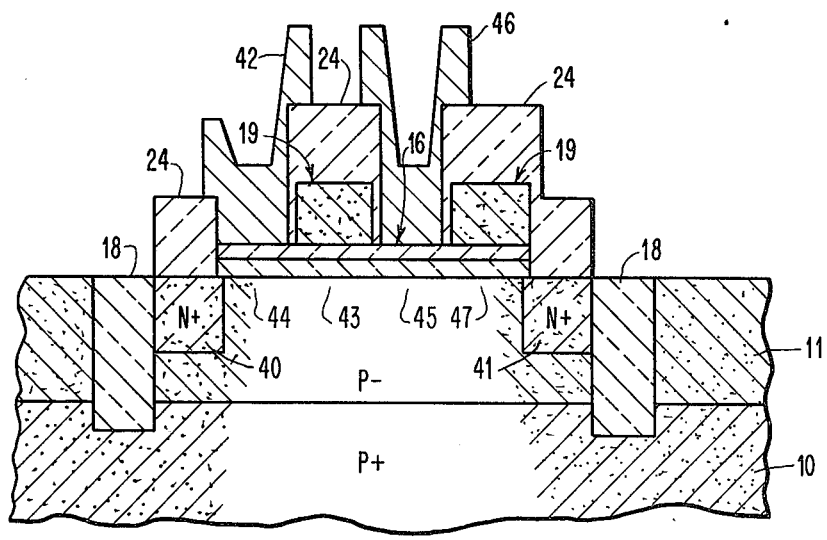
FIG. 12 is a fragmentary sectional view showing a portion of a further semiconductor device of the present invention with the vertical scale being approximately ten times the horizontal scale.

Referring to FIG. 12, there is shown a semiconductor device having four FETs arranged in series with alternate metal and silicon gates between two of the insulating barriers 18. A pair of diffusions 40 and 41 is formed in the epitaxial layer 11 between the two insulating barriers 18 and adjacent thereto. A metallic contact 42 is disposed over a portion of the insulating layer 16 of silicon nitride and silicon dioxide between portions of the layer 24 of silicon dioxide. Thus, a first metal gate FET is formed with the diffusion 40 forming one of the drain and source areas, an area 43 in the epitaxial layer 11 beneath the layer 19 of polysilicon forming the other of the drain and source areas of the metal gate FET, and an area 44 in the epitaxial layer 11 beneath the contact 42 forming the channel area.

The area 43 in the epitaxial layer 11 beneath the layer 19 of polysilicon functions as a channel area for a second FET, which is a silicon gate FET, with the area 44 beneath the metallic contact 42 being one of the drain and source areas and an area 45 in the epitaxial layer 11 beneath a metallic contact 46 being the other of the source and drain areas.

A third FET, which is a metal gate FET, is formed by the areas 43 and 45 and an area 47 in the epitaxial layer 11 beneath another segment of the layer 19 of polysilicon.

The area 47 also functions as a channel area of a fourth FET with the area 45 and the diffusion 41 forming the drain and source areas. Thus, a silicon gate FET is formed. Accordingly, there are four FETs in series having alternate metal and silicon gates with the areas 43-45 and 47 electrically isolated from non-common areas of other surface leakage sensitive devices by the barriers 18.

While the present invention has shown and described the surface leakage sensitive devices as either an FET or FET in series with a capacitor, it should be understood that any type of surface leakage sensitive device could be formed in the epitaxial layer 11. Other examples would be a charge coupled device, a field induced capacitor, a dynamic storage cell, or a dynamic logic cell using FET devices.

While the present invention has described the substrate 10 and the epitaxial layer 11 as being of P conductivity type, it should be understood that the invention also is applicable to the substrate 10 and the epitaxial layer 11 being of N conductivity type. It also should be understood that it is not necessary for the substrate 10 to be formed of silicon since any other suitable semiconductor material could be employed.

An advantage of this invention is that it reduces the leakage current of a storage cell having a capacitor to store the data so that the storage cell retains its charge more effectively. Another advantage of this invention is that it increases the density of storage cells on a single chip while retaining the yield obtained with a chip having a much smaller density of storage cells. A further advantage of this invention is that it eliminates unnecessary diffusions in storage cells having an FET in series with a capacitor. Still another advantage of this invention is that it reduces the bit line capacitance of storage cells on a chip. A still further advantage of this invention is that it eliminates surface leakage currents. Yet another advantage of this invention is that it reduces the number of contacts necessary to a surface leakage sensitive device. Yet still another advantage of this invention is the planarity of the polysilicon layer which minimizes the likelihood of structural defects therein.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor device comprising:

a heavily doped semiconductor substrate;

a lightly doped epitaxial layer overlying a surface of said substrate and having the same conductivity type as said substrate;

an electrically insulating layer disposed on the surface of said epitaxial layer at selected locations and comprising a separate portion at each location;

said epitaxial layer having a surface leakage sensitive device therein beneath each separated portion of said insulating layer;

a plurality of electrically insulating barriers extending from the surface of said epitaxial layer through said epitaxial layer and into said substrate to electrically isolate surface leakage sensitive areas of said devices from each other;

said insulating barriers having a depth greater than the depth of said insulating layer, the depth of said insulating barriers being at least as great as that of said epitaxial layer;

a highly doped diffusion of opposite conductivity type to said substrate and said epitaxial layer disposed in said epitaxial layer and in contact with said insulating barriers;

each of said insulating barriers extending into said substrate for a distance less than the thickness of said substrate and laterally surrounding each said surface leakage sensitive device except where each said barrier is discontinuous to allow a conductive path between said diffusion and a respective one of said surface leakage sensitive devices;

said conductive path comprising the entire thickness of said epitaxial layer said diffusion and each of said surface leakage sensitive devices being located on opposite sides of said discontinuous barriers; and each said conductive path constituting a component part of a respective one of said surface leakage sensitive devices.

2. The semiconductor device according to claim 1 in which said insulating barriers are formed of silicon dioxide.

3. The semiconductor device according to claim 1 in which each said surface leakage sensitive device includes a field effect transistor and each said conductive path constitutes the channel thereof.

4. The semiconductor device according to claim 1 in which said substrate is monocrystalline silicon.

5. The semiconductor device according to claim 4 in which:

said substrate has a thickness several times the thickness of said epitaxial layer;

and each of said insulating barriers extends into said substrate for a thickness less than the thickness of said epitaxial layer.

6. The semiconductor device according to claim 1 in which said insulating barrier extends above the surface of said epitaxial layer in any area in which said insulating layer is disposed on the surface of said epitaxial layer and extends to the surface of said epitaxial layer in all other areas to separate each of said portions of said insulating layer from adjacent portions.

* * * * *